US012058835B2

(12) United States Patent
Koyama et al.

(10) Patent No.: US 12,058,835 B2
(45) Date of Patent: Aug. 6, 2024

(54) INFORMATION PROCESSING APPARATUS AND COOLING METHOD

(71) Applicant: FUJITSU LIMITED, Kawasaki (JP)

(72) Inventors: Kiichi Koyama, Kawasaki (JP); Tatsuya Sudo, Kawasaki (JP); Kazuo Tanaka, Inagi (JP); Hirotaka Shikada, Machida (JP); Hiroshi Nagaoka, Meguro (JP); Hirofumi Konno, Sagamihara (JP); Takatoshi Katou, Kawasaki (JP); Nobuyoshi Aida, Suginami (JP); Masafumi Asano, Kawasaki (JP); Kazuo Kubo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 205 days.

(21) Appl. No.: 17/730,596

(22) Filed: Apr. 27, 2022

(65) Prior Publication Data
US 2023/0036035 A1 Feb. 2, 2023

(30) Foreign Application Priority Data
Jul. 27, 2021 (JP) ................. 2021-122626

(51) Int. Cl.
*H05K 7/20* (2006.01)
*G06F 1/20* (2006.01)

(52) U.S. Cl.
CPC ......... *H05K 7/20145* (2013.01); *G06F 1/206* (2013.01); *H05K 7/20172* (2013.01)

(58) Field of Classification Search
CPC ........... H05K 7/20145; H05K 7/20172; H05K 7/20181; H05K 7/20163; H05K 7/20136
See application file for complete search history.

(56) References Cited

U.S. PATENT DOCUMENTS

| 5,546,272 A * | 8/1996 | Moss .................... H05K 7/2019 361/679.48 |
| 6,678,157 B1 * | 1/2004 | Bestwick ........... H05K 7/20163 165/104.34 |
| 7,031,154 B2 * | 4/2006 | Bash ................... H05K 7/20736 236/49.5 |
| 7,722,359 B1 * | 5/2010 | Frangioso, Jr. ...... H05K 7/1445 361/679.48 |
| 9,338,923 B2 * | 5/2016 | Lee ......................... G06F 1/203 |
| 9,578,786 B1 * | 2/2017 | Beall .................. H05K 7/20754 |

(Continued)

FOREIGN PATENT DOCUMENTS

| JP | 2016-157237 A | 9/2016 |
| JP | 2020-107312 A | 7/2020 |

*Primary Examiner* — Jacob R Crum
*Assistant Examiner* — Matthew Sinclair Muir
(74) *Attorney, Agent, or Firm* — ArentFox Schiff LLP

(57) ABSTRACT

An information processing apparatus comprises a first heat generation circuit, a second heat generation circuit, a blocking assembly, and a processor. The blocking assembly performs a first operation of blocking air flowing from the first heat generation circuit toward the second heat generation circuit or a second operation of passing the air, and the processor is configure to instruct the blocking assembly to perform the first operation in a case where a temperature of the air is higher than a predetermined value, and instruct the blocking assembly to perform the second operation in a case where the temperature of the air is lower than the predetermined value.

6 Claims, 11 Drawing Sheets

(56) References Cited

U.S. PATENT DOCUMENTS

| | | | |
|---|---|---|---|
| 10,149,406 B2* | 12/2018 | Shirakami | H05K 7/20145 |
| 2009/0016019 A1* | 1/2009 | Bandholz | H05K 7/20736 |
| | | | 361/695 |
| 2011/0184568 A1* | 7/2011 | Tai | G05D 23/1934 |
| | | | 700/282 |
| 2020/0214177 A1 | 7/2020 | Chen et al. | |
| 2021/0259138 A1* | 8/2021 | Korolenko | G06F 1/20 |

* cited by examiner

INFORMATION PROCESSING APPARATUS AND COOLING METHOD

CROSS-REFERENCE TO RELATED APPLICATION

This application is based upon and claims the benefit of priority of the prior Japanese Patent Application No. 2021-122626, filed on Jul. 27, 2021, the entire contents of which are incorporated herein by reference.

FIELD

The embodiments discussed herein are related to a cooling technology of an information processing apparatus.

BACKGROUND

An information processing apparatus (computer) such as a server includes an electronic component (circuit) such as a central processing unit (CPU) or a memory and an auxiliary storage device such as a hard disk drive (HDD) or a solid-state drive (SSD). These electronic component and auxiliary storage device are components serving as main heat generation sources in the information processing apparatus.

In order to suppress an influence of heating on a performance and a lifetime of the component, outside air is taken by a fan provided in a housing of the information processing apparatus to perform air cooling of the component. In a server having a large-scale integration (LSI) that monitors or manages a state of the server, the LSI monitors a temperature of each component inside a housing, and controls the temperature of the component by performing air volume control of increasing and decreasing a rotational speed of a fan.

For cooling of the component in an information processing apparatus, there is known a server apparatus capable of efficiently cooling a target object even in a case where a configuration of the target object to be cooled mounted in the server apparatus is different. A dynamic air impedance mechanism in air blowing by a server is also known.

Japanese Laid-open Patent Publication No. 2016-157237 and Japanese Laid-open Patent Publication No. 2020-107312 are disclosed as related art.

SUMMARY

According to an aspect of the embodiments, an information processing apparatus includes a first heat generation circuit, a second heat generation circuit, a blocking assembly that performs a first operation of blocking air flowing from the first heat generation circuit toward the second heat generation circuit or a second operation of passing the air, and a processor that is configured to instruct the blocking assembly to perform the first operation in a case where a temperature of the air is higher than a predetermined value, and instruct the blocking assembly to perform the second operation in a case where the temperature of the air is lower than the predetermined value.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
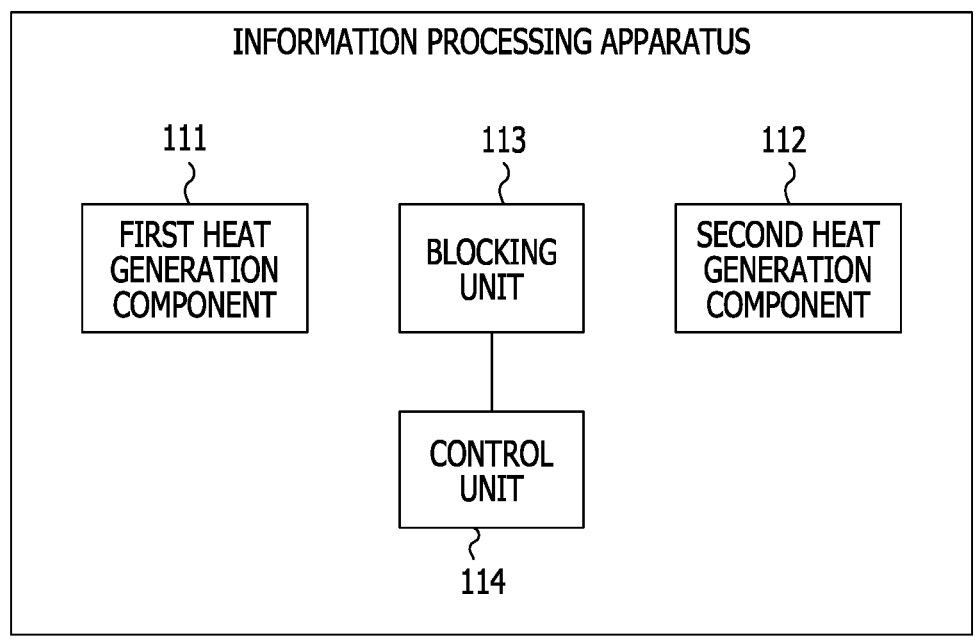
FIG. 1 is a functional configuration diagram of an information processing apparatus according to an embodiment.

In recent years, a Peripheral Component Interconnect (PCI) Express, which is a type of an input and output (I/O) interface of a PCI card, has been revised from Gen1 to Gen5. Along with the revision of the PCI Express, a performance of the PCI card is improved, and power consumption of the PCI card as it is increased. As an example, the power consumption of the PCI card is increased from approximately several W in the related art to 70 W or more.

As described above, heating of the PCI card, which hardly has to be cared about in the related art, is a factor that increases a temperature inside the information processing apparatus. Meanwhile, the current information processing apparatus has a structure in which a CPU, a memory, and an auxiliary storage device, which are main heat generation sources, are effectively cooled, and cooling of a PCI card is not considered so much.

For example, in a case where air flows from a front side toward a rear side in a housing due to rotation of a fan and a slot in which a PCI card is mounted exists behind the main heat generation source, high-temperature air is sent to the PCI card, and thus the PCI card is not effectively cooled.

Such a problem occurs not only in cooling of the PCI card but also in cooling of various heat generation components mounted in the information processing apparatus.

According to one aspect, an object of the present disclosure is to effectively cool a heat generation component mounted on an information processing apparatus.

Hereinafter, embodiments are described in detail with reference to the drawings.

In an information processing apparatus, in a case where a fan that sends air from a front side to a rear side in a housing is rotated at an upper limit rotational speed to cool a PCI card mounted behind main heat generation sources such as a CPU, a memory, and an auxiliary storage device, a noise of the fan is increased. When the fan is rotated at the upper limit rotational speed, power to be consumed by the fan is increased, so that cooling efficiency is decreased.

Meanwhile, it is difficult to cool the PCI card that generates a large amount of heat only by controlling an air volume by increasing or decreasing the rotational speed of the fan. A dedicated cooling mechanism optimized for a PCI card that generates a large amount of heat and an information processing apparatus in which the PCI card is mounted may be employed.

For example, in the dedicated cooling mechanism, a position of a slot in which the PCI card that generates the large amount of heat is mounted is fixed, and a dedicated air guide plate is installed so that air is concentrated at the position. In this case, a configuration of the information processing apparatus is limited, and it is difficult to add a PCI card having a new specification to the existing information processing apparatus. For this reason, in development and sale of the information processing apparatus, there is a case where it is not possible to meet requests of a customer.

In a case where the dedicated cooling mechanism is employed, development, manufacturing, member management, and the like of dedicated components are performed for each information processing apparatus, which leads to an increase in cost and man-hours. Therefore, the dedicated cooling mechanism may not be said to be an efficient countermeasure.

A countermeasure for limiting a use environment temperature of the information processing apparatus is conceivable. Meanwhile, the limitation on the use environment temperature may not be observed. In a case where the limitation on the use environment temperature is not observed, a performance of the PCI card may deteriorate, and in the worst case, there is a concern that the information processing apparatus may be shut down due to shutdown of the PCI card itself.

FIG. 1 illustrates an example of a functional configuration of an information processing apparatus according to an embodiment. In FIG. 1, an information processing apparatus 101 includes a first heat generation component 111, a second heat generation component 112, a blocking unit 113, and a control unit 114. The blocking unit 113 performs a first operation of blocking air flowing from the first heat generation component 111 toward the second heat generation component 112 or a second operation of passing the air flowing from the first heat generation component 111 toward the second heat generation component 112.

In a case where a temperature of the air flowing from the first heat generation component 111 toward the second heat generation component 112 is higher than a predetermined value, the control unit 114 instructs the blocking unit 113 to perform the first operation. By contrast, in a case where the temperature of the air flowing from the first heat generation component 111 toward the second heat generation component 112 is lower than the predetermined value, the control unit 114 instructs the blocking unit 113 to perform the second operation.

With the information processing apparatus 101 illustrated in FIG. 1, the heat generation components mounted on the information processing apparatus 101 may be effectively cooled.

Figure 2:
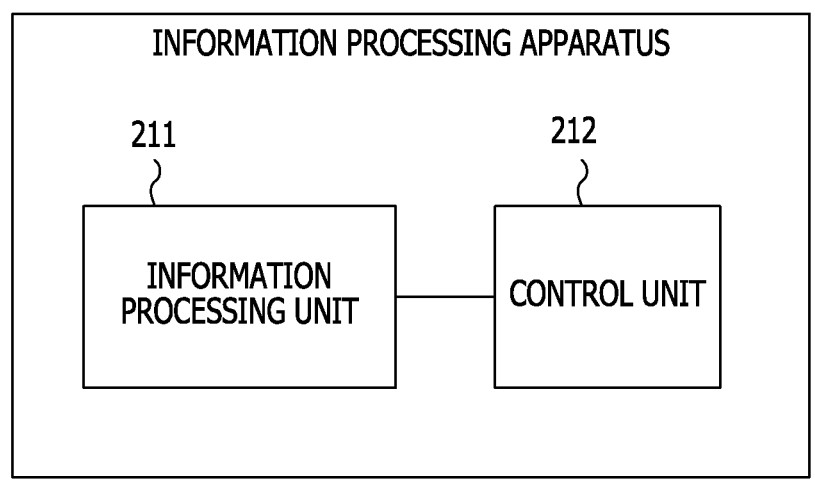
FIG. 2 is a hardware configuration diagram of a specific example of the information processing apparatus.

FIG. 2 illustrates an example of a hardware configuration of a specific example of the information processing apparatus 101 illustrated in FIG. 1. In FIG. 2, an information processing apparatus 201 is, for example, a server, and includes an information processing unit 211 and a control unit 212. The information processing unit 211 and the control unit 212 are hardware. For example, the control unit 212 may be a control LSI. The control unit 212 corresponds to the control unit 114 in FIG. 1.

Figure 3:
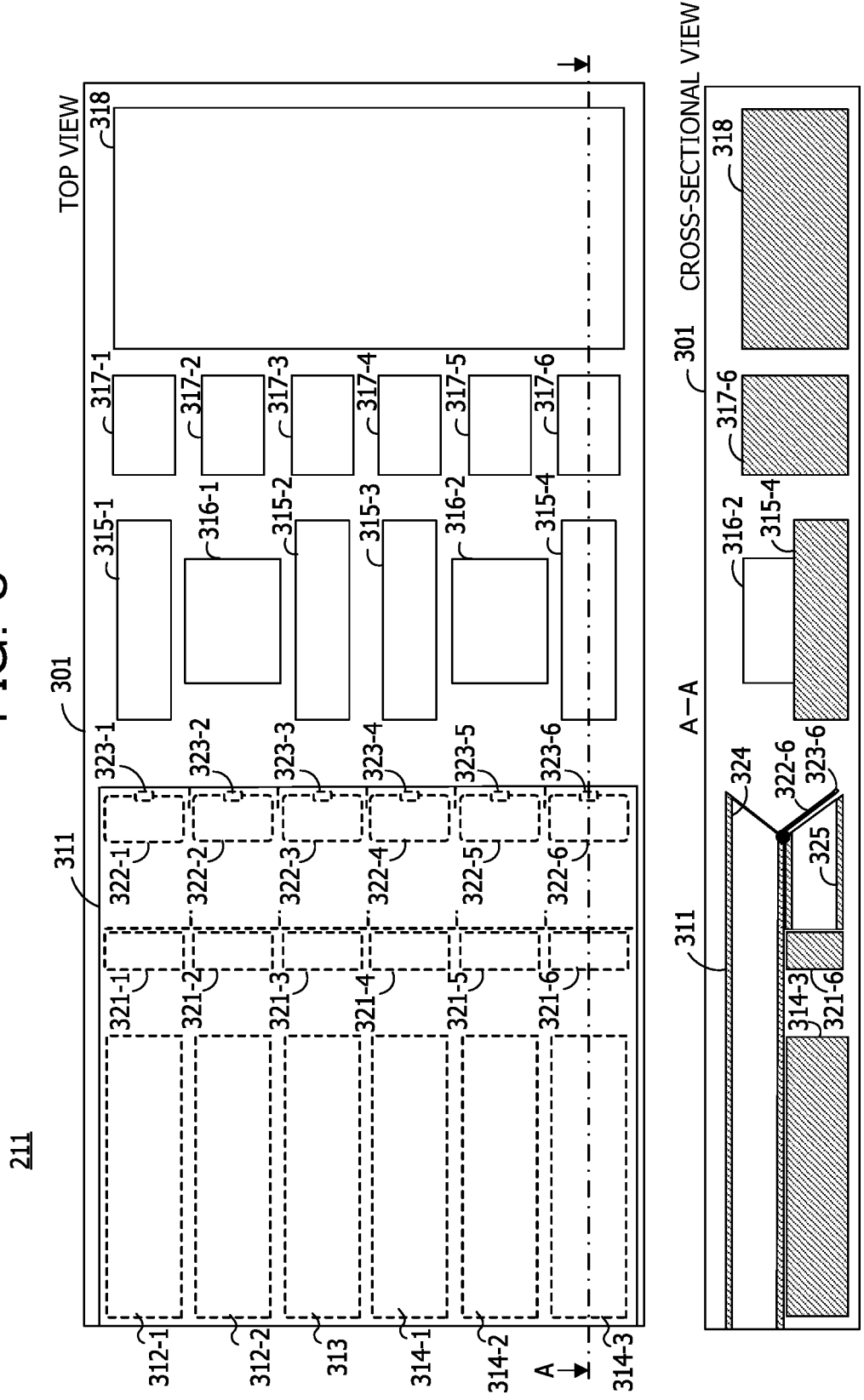
FIG. 3 is a top view and a cross-sectional view of an information processing unit.

FIG. 3 is a top view and a cross-sectional view illustrating an example of the information processing unit 211 in FIG. 2. The cross-sectional view illustrates a cross section taken along a line A-A in the top view.

The information processing unit 211 illustrated in FIG. 3 includes a cooling unit 311, a power source 312-1, a power source 312-2, a free slot 313, and a PCI card 314-1 to a PCI card 314-3. The information processing unit 211 further includes a memory 315-1 to a memory 315-4, a CPU 316-1, a CPU 316-2, a fan 317-1 to a fan 317-6, and an auxiliary storage device 318. These components are hardware, and accommodated in a housing 301. For example, the auxiliary storage device 318 is an HDD or an SSD.

The memory 315-1 to the memory 315-4, the CPU 316-1, the CPU 316-2, and the auxiliary storage device 318 are main heat generation sources, and correspond to the first heat generation component 111 in FIG. 1. The power source 312-1, the power source 312-2, and the PCI card 314-1 to the PCI card 314-3 correspond to the second heat generation component 112 in FIG. 1. The cooling unit 311 corresponds to the blocking unit (or blocking assembly) 113 in FIG. 1.

The PCI card 314-1 and the PCI card 314-3 are PCI cards that consume large power, and the PCI card 314-2 is a PCI card that consumes small power. Therefore, the amounts of heat generated by the PCI card 314-1 and the PCI card 314-3 are larger than the amount of heat generated by the PCI card 314-2. The PCI card 314-1 to the PCI card 314-3 are examples of an expansion card, and are mounted in slots for the expansion card.

A right side in the housing 301 corresponds to a front side in the housing 301, and a left side in the housing 301 corresponds to a rear side in the housing 301. By rotating, the fan 317-1 to the fan 317-6 generate an air flow from the front side toward the rear side in the housing 301. The air flowing from the front side toward the rear side in the housing 301 corresponds to air flowing from the first heat generation component 111 toward the second heat generation component 112.

The cooling unit 311 includes a fan 321-1 to a fan 321-6, a louver 322-1 to a louver 322-6, a temperature sensor 323-1 to a temperature sensor 323-6, an upper duct 324, and a lower duct 325.

The duct 324 guides the air flowing from the front side toward the rear side in the housing 301, toward an outside of the housing 301. The duct 325 guides the air flowing from the front side toward the rear side in the housing 301, toward the power source 312-1, the power source 312-2, and the PCI card 314-1 to the PCI card 314-3. The duct 324 is an example of a second duct, and the duct 325 is an example of a first duct.

Figure 4:
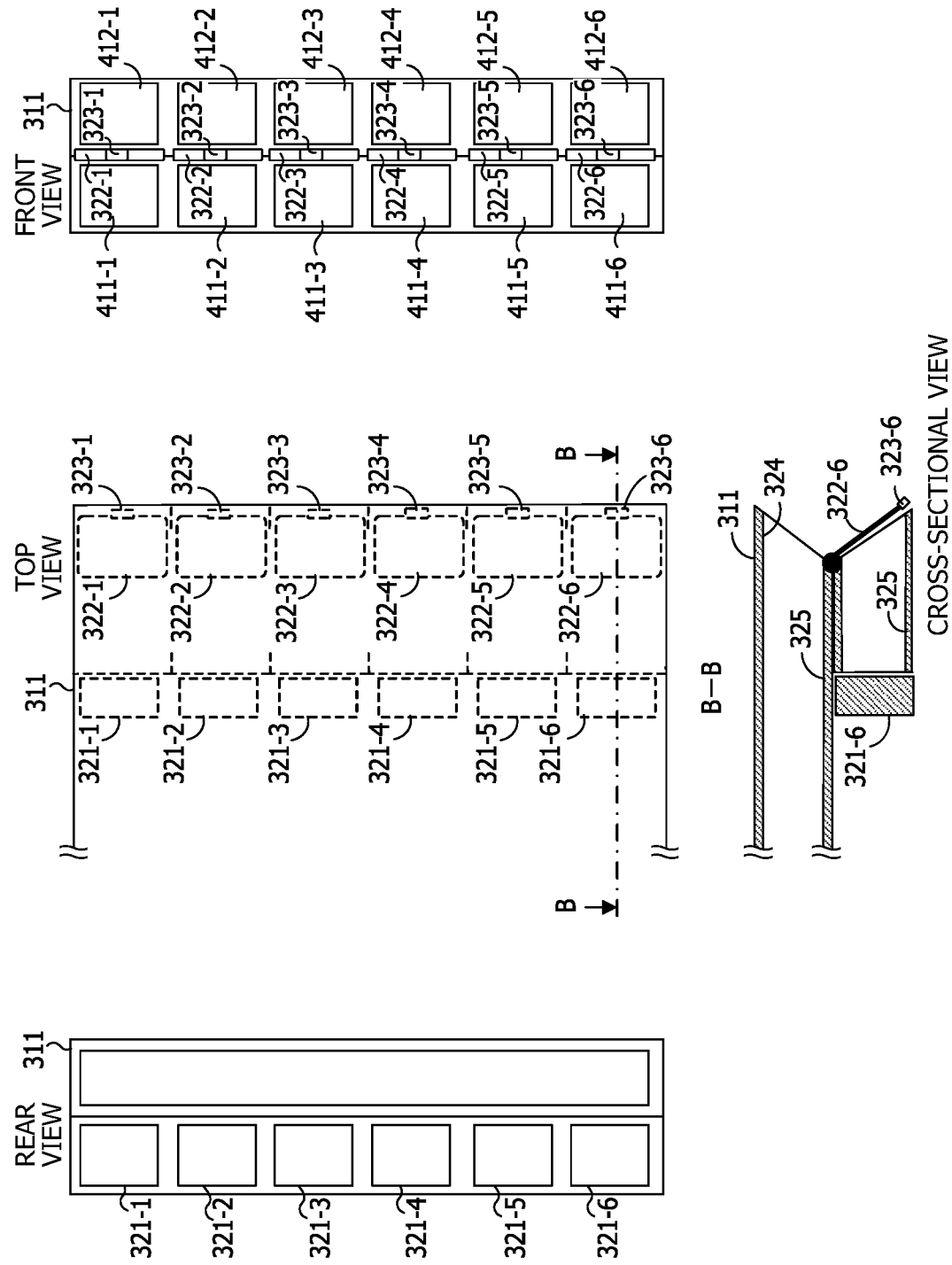
FIG. 4 is a top view, a front view, a rear view, and a cross-sectional view of a cooling unit.

FIG. 4 is a top view, a front view, a rear view, and a cross-sectional view of the cooling unit 311 illustrated in FIG. 3. The cross-sectional view illustrates a cross section taken along a line B-B in the top view.

An intake port 411-1 to an intake port 411-6 are provided at a front side of the duct 324. Air flowing from the intake port 411-1 to the intake port 411-6 into the duct 324 is discharged, from an exhaust port provided at a rear side of the duct 324 to the outside of the housing 301.

An intake port 412-1 to an intake port 412-6 are provided at a front side of the duct 325, and an exhaust port is provided at a rear side of the duct 325 at a position facing each intake port 412-$i$ ($i$=1 to 6). Air flowing from each intake port 412-$i$ into the duct 325 is discharged from the exhaust port facing the intake port 412-$i$.

By providing the duct 324 and the duct 325, it is possible to selectively discharge the air flowing from the front side of the intake port 411-*i* and the intake port 412-*i* to the outside of the housing 301 or behind the exhaust port facing the intake port 412-*i*.

Each fan 321-*i* (i=1 to 6) is provided behind the exhaust port facing the intake port 412-*i*. Each fan 321-*i* discharges the air flowing from the intake port 412-*i* into the duct 325, from the exhaust port facing the intake port 412-*i* toward a heat generation component mounted at a position facing the fan 321-*i*.

For example, the fan 321-1 discharges air flowing from the intake port 412-1 into the duct 325, from an exhaust port facing the intake port 412-1 toward the power source 312-1 located behind the fan 321-1.

The fan 321-2 discharges air flowing from the intake port 412-2 into the duct 325, from an exhaust port facing the intake port 412-2 toward the power source 312-2 located behind the fan 321-2.

The fan 321-4 discharges air flowing from the intake port 412-4 into the duct 325, from an exhaust port facing the intake port 412-4 toward the PCI card 314-1 located behind the fan 321-4.

The fan 321-5 discharges air flowing from the intake port 412-5 into the duct 325, from an exhaust port facing the intake port 412-5 toward the PCI card 314-2 located behind the fan 321-5.

The fan 321-6 discharges air flowing from the intake port 412-6 into the duct 325, from an exhaust port facing the intake port 412-6 toward the PCI card 314-3 located behind the fan 321-6.

By providing the fan 321-*i*, the air flowing from the intake port 412-*i* into the duct 325 may be forcibly discharged toward the heat generation component located behind the fan 321-*i*, and cooling of the heat generation component is promoted.

Each of the louvers 322-*i* (i=1 to 6) shields one of the intake ports 411-*i* and 412-*i*. Each louver 322-*i* shields the intake port 411-*i* by being inclined upward, and shields the intake port 412-*i* by being inclined downward. The louver 322-*i* is an example of a shielding (or a blocking) member. Each louver 322-*i* is actuated to upward or to downward by an actuator, such as a servomotor or an electro-magnetic plunger, etc., according to instructions from the control unit 212.

By shielding the intake port 411-*i* and opening the intake port 412-*i*, air flowing from the front side toward the rear side of the housing 301 passes through the duct 325, and is discharged from the exhaust port facing the intake port 412-*i*.

By opening the intake port 411-*i* and shielding the intake port 412-*i*, air flowing from the front side toward the rear side of the housing 301 passes through the duct 324, and is discharged to the outside of the housing 301.

No wall is provided inside the duct 325, and when the intake port 412-1 shielded by the louver 322-1, for example, the fan 321-1 can provide air from other intake ports to the power source 312-1.

Each temperature sensor 323-*i* (i=1 to 6) is attached to a tip of the louver 322-*i*, and acquires a temperature of air at a front side of the cooling unit 311. Hereinafter, the temperature of the air at the front side of the cooling unit 311 is also referred to as an intake-side temperature. The temperature sensor 323-*i* is an example of a first temperature sensor.

For example, the temperature sensor 323-1 acquires a temperature of air flowing from the memory 315-1, and the temperature sensor 323-2 acquires a temperature of air flowing from the CPU 316-1.

The temperature sensor 323-3 acquires a temperature of air flowing from the memory 315-2, and the temperature sensor 323-4 acquires a temperature of air flowing from the memory 315-3. The temperature sensor 323-5 acquires a temperature of air flowing from the CPU 316-2, and the temperature sensor 323-6 acquires a temperature of air flowing from the memory 315-4.

Figure 5A:
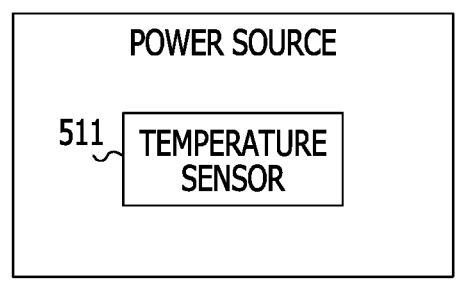
FIGS. 5A and 5B are diagrams illustrating a temperature sensor in a power source and a PCI card.
Figure 5B:
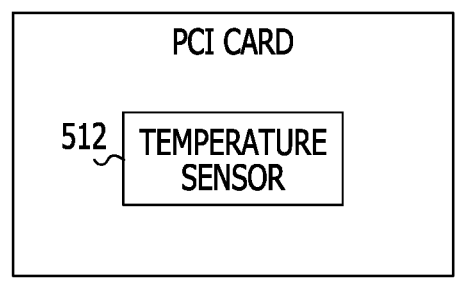

FIGS. 5A and 5B illustrate an example of a temperature sensor in the power source 312-*i* (i=1, 2) and the PCI card 314-*i* (i=1 to 3) in FIG. 3. FIG. 5A illustrates an example of a temperature sensor in the power source 312-*i*. The power source 312-*i* includes a temperature sensor 511 that acquires a temperature of the power source 312-*i*.

FIG. 5B illustrates an example of a temperature sensor in the PCI card 314-*i*. The PCI card 314-*i* includes a temperature sensor 512 that acquires a temperature of the PCI card 314-*i*. The temperature sensor 511 and the temperature sensor 512 are examples of a second temperature sensor.

Figure 6:
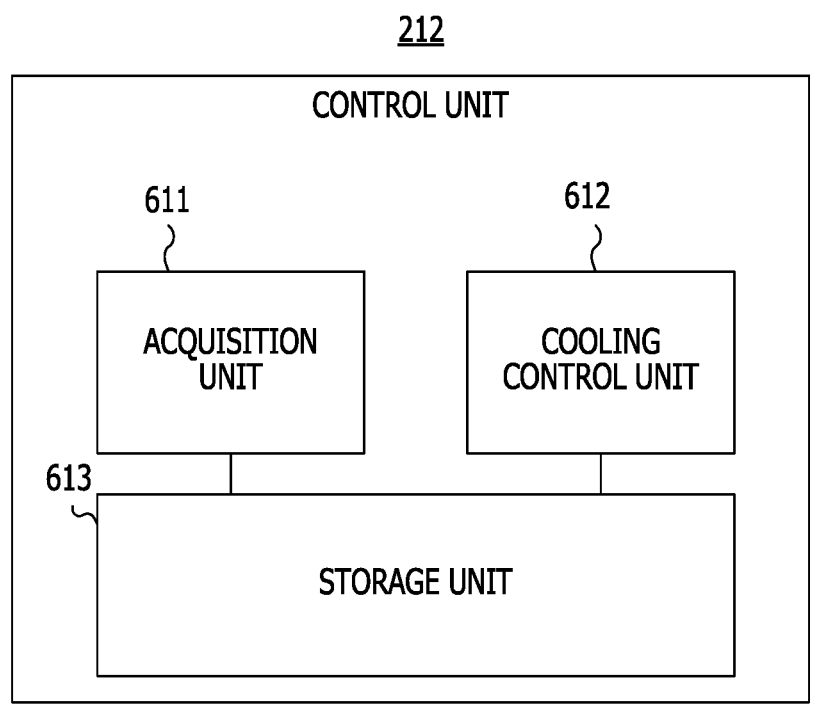
FIG. 6 is a functional configuration diagram of the control unit.

FIG. 6 illustrates a functional configuration example of the control unit 212 in FIG. 2. The control unit 212 in FIG. 6 includes an acquisition unit 611, a cooling control unit 612, and a storage unit 613. For example, the control unit 212 may be a control LSI.

The storage unit 613 stores temperature specification information of each heat generation component in the information processing unit 211. The temperature specification information includes a threshold value of a temperature of the heat generation component.

At a time of activation of the information processing apparatus 201, the acquisition unit 611 acquires mounting information and position information of the heat generation component existing behind each fan 321-*i*. The mounting information indicates whether or not the heat generation component is mounted at a predetermined position, and the position information indicates the position of the mounted heat generation component.

For example, mounting information of the power source 312-1 indicates whether or not the power source 312-1 is mounted at a position behind the fan 321-1, and position information indicates the position of the power source 312-1. Mounting information of the power source 312-2 indicates whether or not the power source 312-2 is mounted at a position behind the fan 321-2, and position information indicates the position of the power source 312-2.

Mounting information of the PCI card 314-1 indicates whether or not the PCI card 314-1 is mounted in a slot behind the fan 321-4, and position information indicates a position of the slot in which the PCI card 314-1 is mounted. Mounting information of the PCI card 314-2 indicates whether or not the PCI card 314-2 is mounted in a slot behind the fan 321-5, and position information indicates a position of the slot in which the PCI card 314-2 is mounted. Mounting information of the PCI card 314-3 indicates whether or not the PCI card 314-3 is mounted in a slot behind the fan 321-6, and position information indicates a position of the slot in which the PCI card 314-3 is mounted.

During an operation of the information processing apparatus 201, the acquisition unit 611 acquires temperatures of the memory 315-1 to the memory 315-4, the CPU 316-1, the CPU 316-2, and the auxiliary storage device 318. The acquisition unit 611 acquires an intake-side temperature from the temperature sensor 323-*i*, a temperature of the power source 312-*i* from the temperature sensor 511, and a temperature of the PCI card 314-*i* from the temperature sensor 512.

The acquisition unit 611 acquires a rotational speed of the fan 317-*i* from the fan 317-*i*, and acquires a rotational speed of the fan 321-*i* from the fan 321-*i*. The acquisition unit 611 stores the acquired temperature and rotational speed in the storage unit 613. The acquisition unit 611 may periodically acquire the temperature and the rotational speed.

In the same manner as in the related art, the cooling control unit 612 monitors the acquired temperatures of the memory 315-1 to the memory 315-4, the CPU 316-1, the CPU 316-2, and the auxiliary storage device 318. By using the temperature specification information of these heat generation components, the cooling control unit 612 performs air volume control of increasing or decreasing the rotational speed of the fan 317-*i* to control the temperatures of these heat generation components.

The cooling control unit 612 further controls the cooling unit 311. In a case where the intake-side temperature acquired from the temperature sensor 323-*i* is higher than a predetermined value, the cooling control unit 612 instructs the cooling unit 311 to perform an exhaust operation. As the predetermined value, for example, a temperature of a heat generation component behind the fan 321-*i*, which is acquired from the temperature sensor 511 or the temperature sensor 512, is used.

During the exhaust operation, the louver 322-*i* shields the intake port 412-*i*, so that air flowing from the intake port 411-*i* into the duct 324 is discharged to the outside of the housing 301. As a result, hot air having a temperature higher than a temperature of the heat generation component behind the fan 321-*i* is forcibly discharged, and heating of the heat generation component is suppressed. The exhaust operation corresponds to a first operation.

By contrast, in a case where the intake-side temperature acquired from the temperature sensor 323-*i* is lower than the predetermined value, the cooling control unit 612 instructs the cooling unit 311 to perform a cooling operation.

During the cooling operation, the louver 322-*i* shields the intake port 411-*i* and the fan 321-*i* rotates, so that air flowing from the intake port 412-*i* into the duct 325 is discharged toward the heat generation component behind the fan 321-*i*. Therefore, it is possible to cool the heat generation component by using cold air having a temperature lower than the temperature of the heat generation component behind the fan 321-*i*. The cooling operation corresponds to a second operation.

As a temperature of a heat generation component in front of the cooling unit 311 increases, a temperature of air cooling the heat generation component also increases, and hot air is generated at a front side of the cooling unit 311. By causing the cooling unit 311 to perform an operation of discharging the hot air and discharging only the cold air to the heat generation component, in accordance with the intake-side temperature acquired from the temperature sensor 323-*i*, it is possible to effectively cool the heat generation component behind the fan 321-*i*.

For example, even in a case where heat generation components that generate large amounts of heat, such as the PCI card 314-1 and the PCI card 314-3, are mounted behind a main heat generation source, these heat generation components may be effectively cooled. In this case, since the fan 317-*i* for cooling the main heat generation source does not have to be rotated at an upper limit rotational speed, noise and power consumption of the fan 317-*i* may be suppressed.

As an example, the cooling unit 311 is a general-purpose type that is mountable in a rack-type information processing apparatus. Meanwhile, even in another information processing apparatus, the cooling unit 311 may be mounted as an option as long as a power source and a control interface are included.

Therefore, the degree of freedom of the configuration of the information processing apparatus is increased, and it is easy to add a PCI card having a new specification to the existing information processing apparatus. Since a dedicated cooling mechanism does not have to be provided, development, manufacturing, member management, and the like of dedicated components do not have to be performed for each information processing apparatus, and thus cost and man-hours are reduced.

It is not desirable to limit a use environment temperature of the information processing apparatus, and deterioration in performance and shutdown of the PCI card may be suppressed. Therefore, shutdown of the information processing apparatus is also suppressed.

Instead of the louver 322-*i*, another shielding member such as a shutter or a film-shaped screen may be used to shield the intake port 411-*i* or the intake port 412-*i*.

Figure 7:
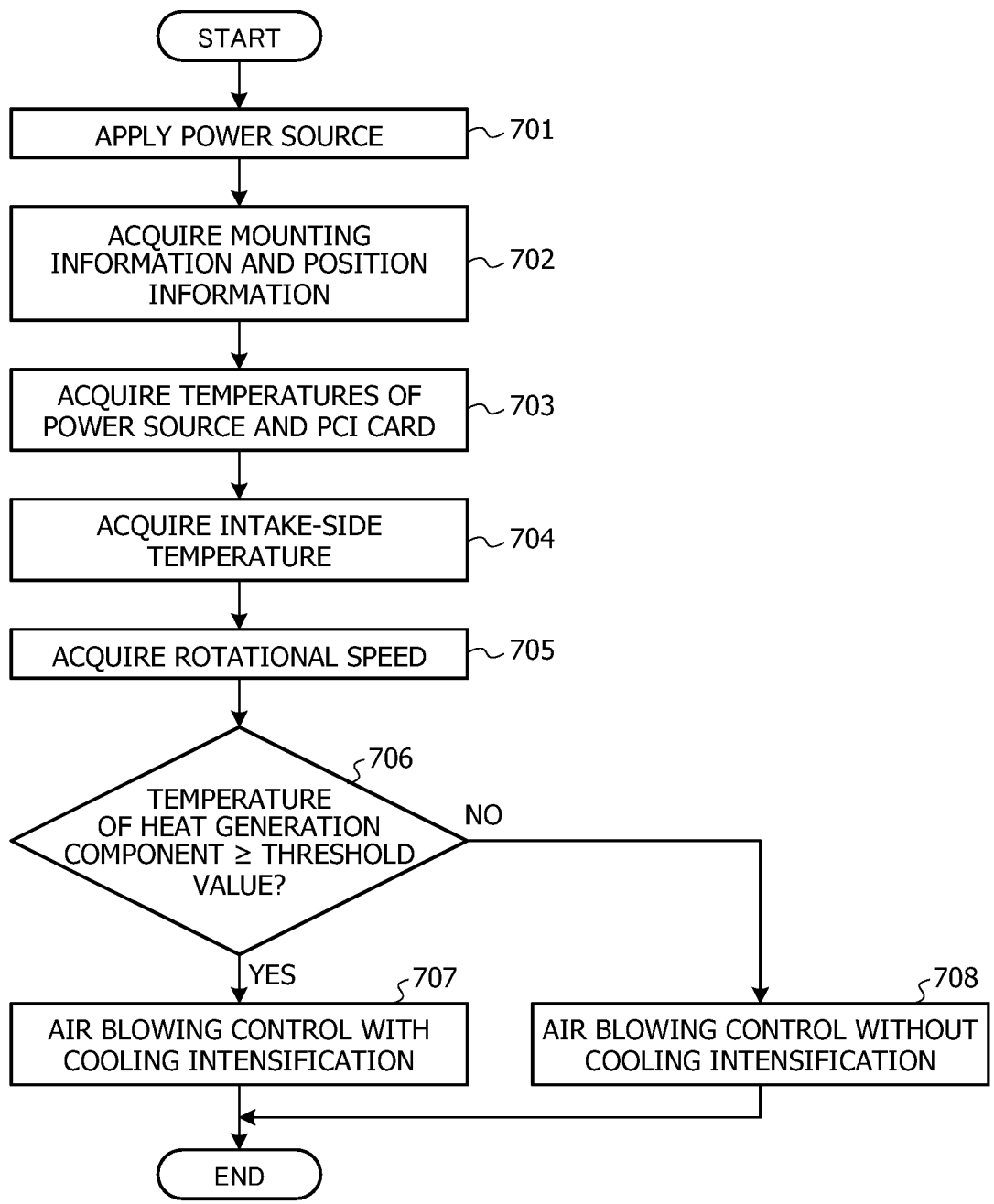
FIG. 7 is a flowchart of a cooling process.

FIG. 7 is a flowchart illustrating an example of a cooling process in which the information processing apparatus 201 in FIG. 2 controls the cooling unit 311. Each fan 321-*i* of the cooling unit 311 performs one rotation operation of high-speed rotation and low-speed rotation. A rotational speed of the high-speed rotation is higher than a rotational speed of the low-speed rotation.

First, a user applies a power source on the information processing apparatus 201 (step 701), and the acquisition unit 611 of the control unit 212 acquires mounting information and position information of each heat generation component (step 702).

After that, the acquisition unit 611 acquires a temperature of the power source 312-*i* from the temperature sensor 511, and acquires a temperature of the PCI card 314-*i* from the temperature sensor 512 (step 703). The acquisition unit 611 acquires an intake-side temperature from the temperature sensor 323-*i* of the cooling unit 311 (step 704), and acquires a rotational speed of the fan 321-*i* from the fan 321-*i* (step 705).

Next, the cooling control unit 612 compares the temperature of each heat generation component with a threshold value included in temperature specification information of the heat generation component (step 706). Each heat generation component is the power source 312-*i* or the PCI card 314-*i*.

In a case where the temperature of any of the heat generation components is equal to or higher than the threshold value (YES in step 706), the cooling control unit 612 performs air blowing control with cooling intensification (step 707). By contrast, in a case where the temperatures of all the heat generation components are lower than the threshold value (NO in step 706), the cooling control unit 612 performs the air blowing control without the cooling intensification (step 708).

Figure 8:
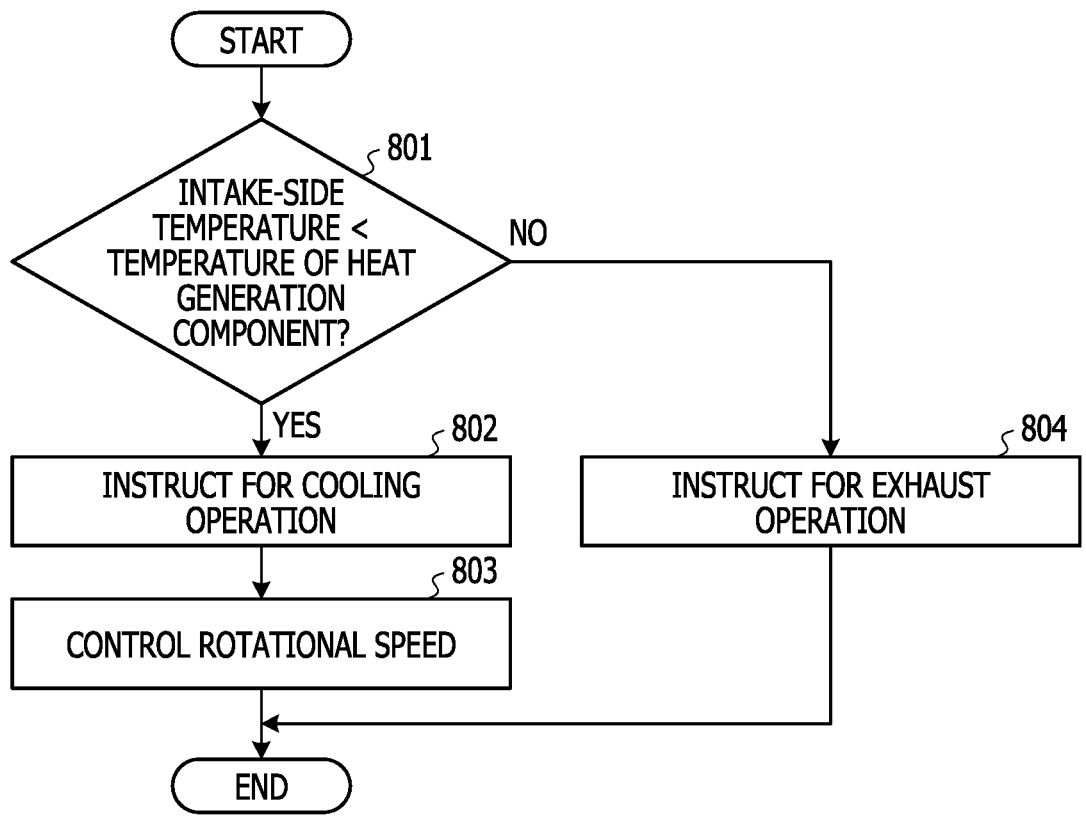
FIG. 8 is a flowchart of air blowing control with cooling intensification.

FIG. 8 is a flowchart illustrating an example of air blowing control with cooling intensification in step 707 in FIG. 7. First, the cooling control unit 612 compares a temperature of each heat generation component with an intake-side temperature acquired from the temperature sensor 323-*i* corresponding to the heat generation component (step 801).

The temperature sensor 323-*i* corresponding to a heat generation component is a temperature sensor 323-*i* attached to the louver 322-*i* that shields the intake port 412-*i* existing in front of the heat generation component. The intake port 412-*i* located in front of the heat generation component is located at a position facing an exhaust port provided in front of the fan 321-*i* that discharges cold air toward the heat generation component, in the duct 325.

In a case where the intake-side temperature is lower than the temperature of the heat generation component (YES in step 801), the cooling control unit 612 instructs the cooling unit 311 to perform a cooling operation (step 802), and performs rotational speed control on the fan 321-*i* (step 803). Therefore, the louver 322-*i* shields the intake port 411-*i*, and air flowing from the intake port 412-*i* into the duct 325 is discharged toward the heat generation component.

By contrast, in a case where the intake-side temperature is equal to or higher than the temperature of the heat generation component (NO in step 801), the cooling control unit 612 instructs the cooling unit 311 to perform an exhaust operation (step 804). Therefore, the louver 322-*i* shields the intake port 412-*i*, and the air flowing from the intake port 411-*i* to the duct 324 is discharged to the outside of the housing 301.

In step 801, in a case where no heat generation component is mounted at a position facing the fan 321-*i*, the cooling control unit 612 uses a specific temperature determined in advance as the temperature of the heat generation component, and compares the specific temperature with the intake-side temperature.

Figure 9:
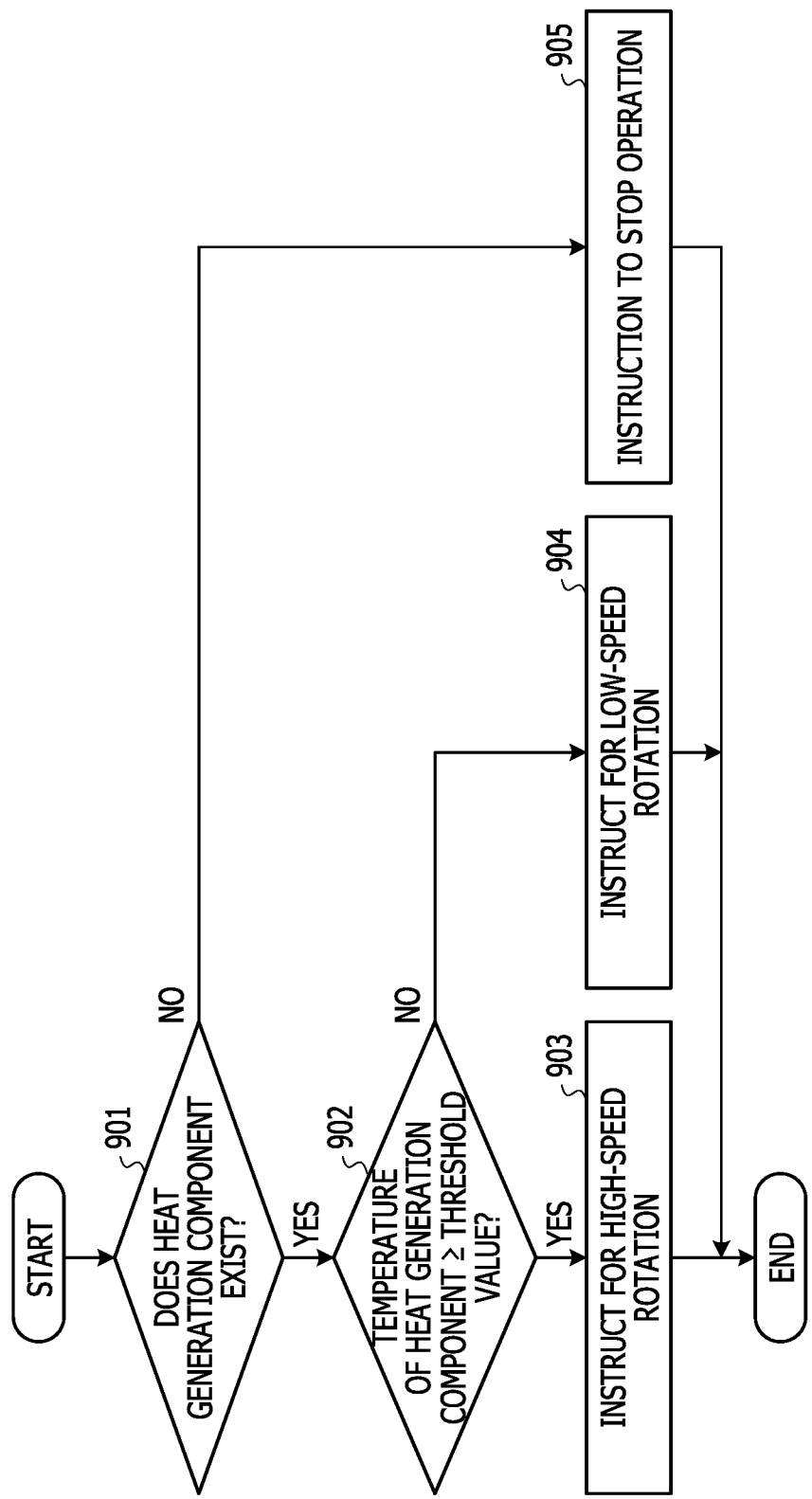
FIG. 9 is a flowchart of rotational speed control.

FIG. 9 is a flowchart illustrating an example of rotational speed control in step 803 in FIG. 8. First, the cooling control unit 612 refers to acquired mounting information to check whether or not a heat generation component is mounted at a position facing the fan 321-*i* (step 901).

In a case where the heat generation component is mounted at the position facing the fan 321-*i* (YES in step 901), the cooling control unit 612 compares a temperature of the heat generation component with a threshold value included in temperature specification information of the heat generation component (step 902).

In a case where the temperature of the heat generation component is equal to or higher than the threshold value (YES in step 902), the cooling control unit 612 instructs the fan 321-*i* to rotate at a high speed (step 903). Therefore, the high-temperature heat generation component is rapidly cooled.

By contrast, in a case where the temperature of the heat generation component is lower than the threshold value (NO in step 902), the cooling control unit 612 instructs the fan 321-*i* to rotate at a low speed (step 904). Therefore, the heat generation component that generates less heat is slowly cooled.

In a case where no heat generation component is mounted at the position facing the fan 321-*i* (NO in step 901), the cooling control unit 612 instructs the fan 321-*i* to stop the operation (step 905). Therefore, it is possible to suppress cold air from being discharged from an exhaust port in front of the fan 321-*i*, and to easily guide the cold air to another exhaust port and use the cold air for cooling the heat generation component.

Figure 10:
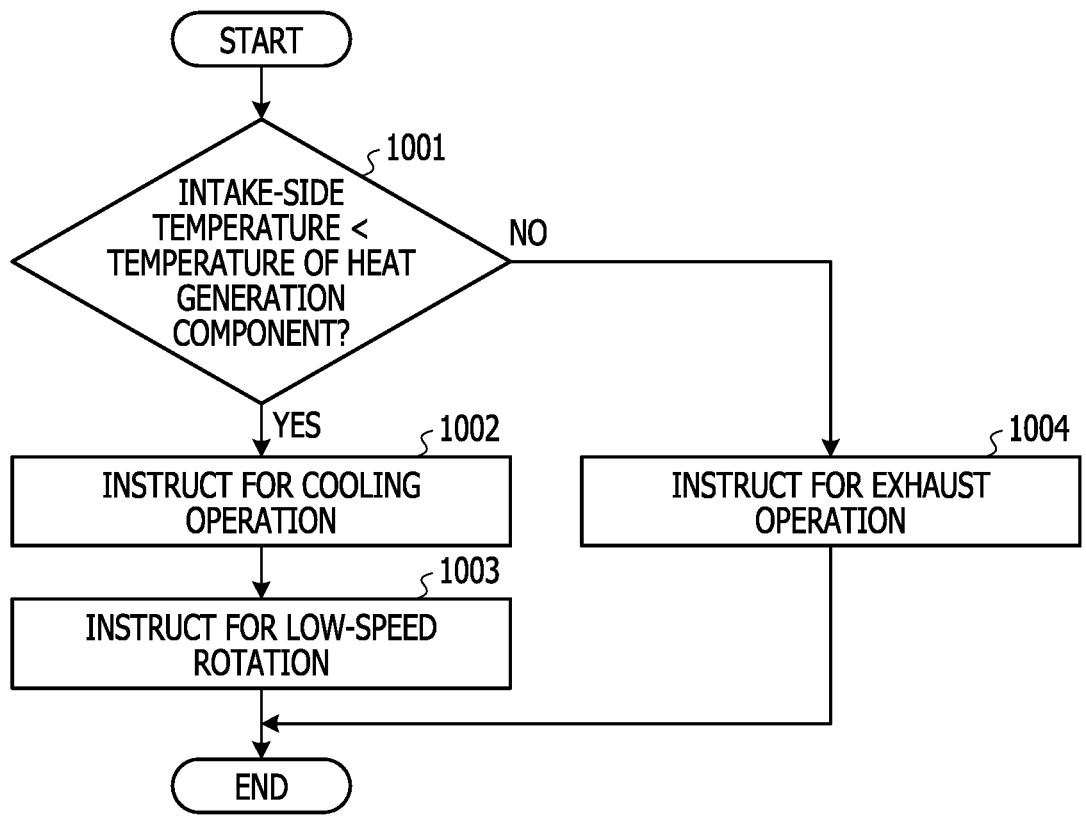
FIG. 10 is a flowchart of air blowing control without cooling intensification.

FIG. 10 is a flowchart illustrating an example of air blowing control without cooling intensification in step 708 in FIG. 7. First, the cooling control unit 612 compares a temperature of each heat generation component with an intake-side temperature acquired from the temperature sensor 323-*i* corresponding to the heat generation component (step 1001).

In a case where the intake-side temperature is lower than the temperature of the heat generation component (YES in step 1001), the cooling control unit 612 instructs the cooling unit 311 to perform a cooling operation (step 1002), and instructs all the fans 321-*i* to rotate at a low speed (step 1003).

Therefore, the louver 322-*i* shields the intake port 411-*i*, and air flowing from the intake port 412-*i* into the duct 325 is discharged toward the heat generation component. By all the fans 321-*i* rotating at a low speed, warmed air is suppressed from staying in the housing 301, and the heat generation component that generates less heat is slowly cooled.

By contrast, in a case where the intake-side temperature is equal to or higher than the temperature of the heat generation component (NO in step 1001), the cooling control unit 612 instructs the cooling unit 311 to perform an exhaust operation (step 1004). Therefore, the louver 322-*i* shields the intake port 412-*i*, and the air flowing from the intake port 411-*i* to the duct 324 is discharged to the outside of the housing 301.

In step 1001, in a case where no heat generation component is mounted at a position facing the fan 321-*i*, the cooling control unit 612 uses a specific temperature determined in advance as the temperature of the heat generation component, and compares the specific temperature with the intake-side temperature.

For example, a case where temperatures of the power source 312-1, the power source 312-2, and the PCI card 314-2 are lower than a threshold value, and temperatures of the PCI card 314-1 and the PCI card 314-3 are equal to or higher than the threshold value is assumed.

In this case, in step 702 in FIG. 7, mounting information indicating that the power source 312-1, the power source 312-2, and the PCI card 314-1 to the PCI card 314-3 are mounted and position information of the heat generation components are acquired. Mounting information indicating that a PCI card is not mounted in the free slot 313 is acquired.

Next, in step 706, it is determined that temperatures of the PCI cards 314-1 and 314-3 are equal to or higher than a threshold value, and it is determined that temperatures of the power source 312-1, the power source 312-2, and the PCI card 314-2 are lower than the threshold value. In this case, in step 707, air blowing control with cooling intensification is performed.

In step 801 in FIG. 8, it is determined that an intake-side temperature acquired from the temperature sensor 323-4 is lower than a temperature of the PCI card 314-1, and it is determined that an intake-side temperature acquired from the temperature sensor 323-6 is lower than a temperature of the PCI card 314-3. In step 802, the louver 322-4 and the louver 322-6 respectively shield the intake port 411-4 and the intake port 411-6.

Next, in step 903 in FIG. 9, high-speed rotation is instructed to the fan 321-4 and the fan 321-6, and the PCI card 314-1 and the PCI card 314-3 are rapidly cooled.

In step 801 in FIG. 8, it is determined that an intake-side temperature acquired from the temperature sensor 323-1 is lower than a temperature of the power source 312-1, and it is determined that an intake-side temperature acquired from the temperature sensor 323-2 is lower than a temperature of the power source 312-2. It is determined that an intake-side temperature acquired from the temperature sensor 323-5 is lower than a temperature of the PCI card 314-2.

In step 802, the louver 322-1, the louver 322-2, and the louver 322-5 respectively shield the intake port 411-1, the intake port 411-2, and the intake port 411-5.

Next, in step 904-in FIG. 9, low-speed rotation is instructed to the fans 321-1, 321-2, and 321-5, and the power source 312-1, the power source 312-2, and the PCI card 314-2 are slowly cooled.

In step 801 in FIG. 8, it is determined that an intake-side temperature acquired from the temperature sensor 323-3 is lower than a specific temperature. In step 802, the louver 322-3 shields the intake port 411-3.

Next, in step 905 in FIG. 9, an operation stop is instructed to the fan 321-3, and cold air flowing from the intake port 412-3 is guided to an exhaust port facing the other intake port 412-i.

Figure 11:
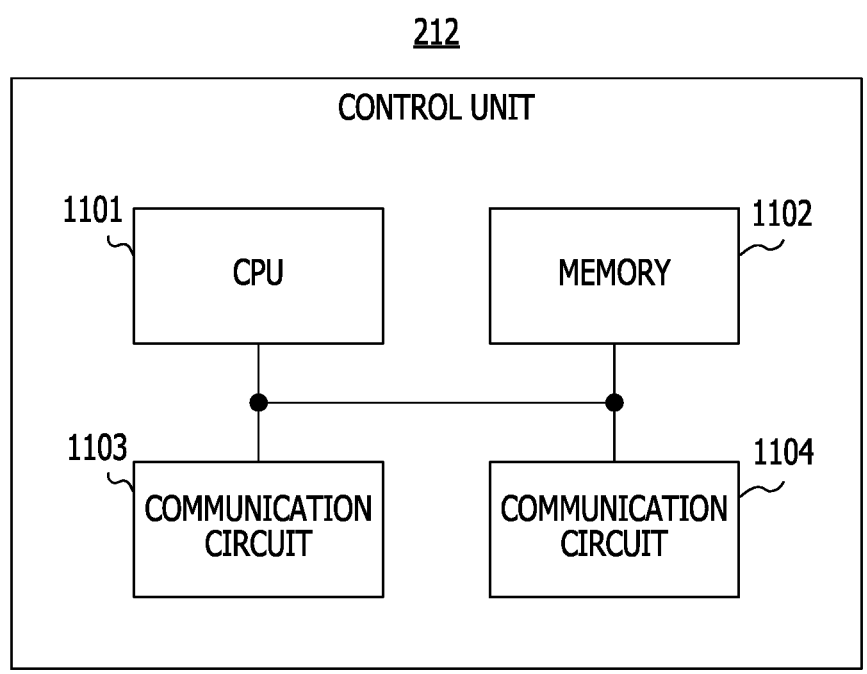
FIG. 11 is a hardware configuration diagram of a control unit.

FIG. 11 illustrates an example of a hardware configuration of the control unit 212 illustrated in FIG. 2. The control unit 212 in FIG. 11 includes a CPU 1101 (processor), a memory 1102, a communication circuit 1103, and a communication circuit 1104. Each of these components is hardware.

The memory 1102 is, for example, a semiconductor memory such as a read-only memory (ROM) or a random-access memory (RAM), and stores a program and data used for processing. The memory 1102 may operate as the storage unit 613 illustrated in FIG. 6.

For example, the CPU 1101 executes the program by using the memory 1102 to operate as the acquisition unit 611 and the cooling control unit 612 illustrated in FIG. 6.

The communication circuit 1103 is coupled to a control bus such as an inter-integrated circuit (I2C) bus, and communicates with the power source 312-i, PCI card 314-i, the fan 321-i, the louver 322-i, and the temperature sensors 323-i via the control bus. The communication circuit 1103 also communicates with the memory 315-i, the CPU 316-i, the fan 317-i, and the auxiliary storage device 318 via the control bus.

The communication circuit 1104 is coupled to a communication network such as a local area network (LAN), a wide area network (WAN), and communicates with a terminal device of an administrator via the communication network. By communicating with the control unit 212 using the terminal device, the administrator may monitor the information processing apparatus 201, and perform a remote operation.

The configuration of the information processing apparatus 101 in FIG. 1 and the information processing apparatus 201 in FIG. 2 is only an example, and some components may be omitted or changed depending on the application or conditions of the information processing apparatus.

The configurations of the information processing unit 211 in FIG. 3 and the cooling unit 311 in FIG. 4 are only examples, and some components may be omitted or changed depending on the application or conditions of the information processing apparatus 201. For example, in a case where an air volume in the duct 325 may be sufficiently secured by the rotation of the fan 317-i, the fan 321-i may be omitted.

The configuration of the power source 312-i and the PCI card 314-i in FIGS. 5A and 5B is only an example, and some components may be omitted or changed depending on the configuration or conditions of the information processing apparatus 201. The configuration of the control unit 212 in FIGS. 6 and 11 is only an example, and some components may be omitted or changed depending on the configuration or conditions of the information processing apparatus 201.

The flowcharts in FIGS. 7 to 10 are only examples, and some of the processes may be omitted or changed depending on the configuration or conditions of the information processing apparatus 201.

Although the disclosed embodiment and its advantages have been described in detail, those skilled in the art could make various modifications, additions, and omissions without deviating from the scope of the present disclosure clearly recited in claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing apparatus comprising:
   a first heat generation circuit;
   a second heat generation circuit;
   a blocking assembly, provided between the first heat generation circuit and the second heat generation circuit, that performs a first operation of blocking air flowing from the first heat generation circuit toward the second heat generation circuit or a second operation of passing the air toward the second heat generation circuit; and
   a processor configured to instruct the blocking assembly to perform the first operation in a case where a temperature of the air is higher than a predetermined value, and instruct the blocking assembly to perform the second operation in a case where the temperature of the air is lower than the predetermined value;
   a housing that accommodates the first heat generation circuit, the second heat generation circuit, and the blocking assembly,
   wherein the blocking assembly includes a first duct that guides the air toward the second heat generation circuit,
   a second duct that guides the air toward an outside of the housing, and
   a shielding member that shields one of an intake port of the first duct and an intake port of the second duct,
   the first operation is an operation in which the shielding member shields the intake port of the first duct, and
   the second operation is an operation in which the shielding member shields the intake port of the second duct;
   wherein the blocking assembly further includes a fan that discharges air in the first duct from an exhaust port of the first duct toward the second heat generation circuit, and
   the second operation includes an operation of rotating the fan.

2. The information processing apparatus according to claim 1,
   wherein the blocking assembly includes a first temperature sensor that acquires a temperature of the air flowing from the first heat generation circuit toward the second heat generation circuit,
   the second heat generation circuit includes a second temperature sensor that acquires a temperature of the second heat generation circuit, and
   the processor acquires the temperature of the air from the first temperature sensor, acquires the temperature of the second heat generation circuit from the second temperature sensor, and uses the temperature of the second heat generation circuit as the predetermined value.

3. The information processing apparatus according to claim 1,
   wherein the first heat generation circuit is a processor, a memory, or an auxiliary storage device, and
   the second heat generation circuit is an expansion card.

4. A cooling method for information processing apparatus that comprises a first heat generation circuit and a second heat generation circuit, the method comprising;
- performing a first operation of blocking air flowing from the first heat generation circuit toward the second heat generation circuit, by using a blocking assembly provided between the first heat generation circuit and the second heat generation circuit, in a case where a temperature of the air is higher than a predetermined value; and
- performing a second operation of passing the air toward the second heat generation circuit, by using the blocking assembly provided between the first heat generation circuit and the second heat generation circuit, in a case where a temperature of the air is lower than the predetermined value;
- wherein the blocking assembly includes:
- a first duct that guides the air toward the second heat generation circuit,
- a second duct that guides the air toward an outside of a housing, and
- a shielding member that shields one of an intake port of the first duct and an intake port of the second duct,
- the first operation is an operation in which the shielding member shields the intake port of the first duct, and
- the second operation is an operation in which the shielding member shields the intake port of the second duct;
- a fan that discharges air in the first duct from an exhaust port of the first duct toward the second heat generation circuit, and
- the second operation includes an operation of rotating the fan.

5. The cooling method according to claim 4, wherein the blocking assembly includes a first temperature sensor that acquires a temperature of the air flowing from the first heat generation circuit toward the second heat generation circuit,
- the second heat generation circuit includes a second temperature sensor that acquires a temperature of the second heat generation circuit, and the cooling method further including:
- acquiring the temperature of the air from the first temperature sensor;
- acquiring the temperature of the second heat generation circuit from the second temperature sensor; and
- using the temperature of the second heat generation circuit as the predetermined value.

6. The cooling method according to claim 4,
- wherein the first heat generation circuit is a processor, a memory, or an auxiliary storage device, and
- the second heat generation circuit is an expansion card.

* * * * *